United States Patent
Makino

(10) Patent No.: US 12,218,085 B2
(45) Date of Patent: Feb. 4, 2025

(54) SUBSTRATE, ELECTRONIC DEVICE, AND METHOD FOR MANUFACTURING SUBSTRATE

(71) Applicant: SONY SEMICONDUCTOR SOLUTIONS CORPORATION, Kanagawa (JP)

(72) Inventor: Hirofumi Makino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 503 days.

(21) Appl. No.: 17/612,645

(22) PCT Filed: Apr. 8, 2020

(86) PCT No.: PCT/JP2020/015778
§ 371 (c)(1),
(2) Date: Nov. 19, 2021

(87) PCT Pub. No.: WO2020/241067
PCT Pub. Date: Dec. 3, 2020

(65) Prior Publication Data
US 2022/0238463 A1    Jul. 28, 2022

(30) Foreign Application Priority Data
May 30, 2019    (JP) .................................. 2019-100900

(51) Int. Cl.
*H01L 21/48*    (2006.01)
*H01L 23/427*    (2006.01)
(Continued)

(52) U.S. Cl.
CPC ............ *H01L 23/66* (2013.01); *H01L 21/486* (2013.01); *H01L 23/427* (2013.01);
(Continued)

(58) Field of Classification Search
CPC ...... H01L 23/66; H01L 21/486; H01L 23/427; H01L 23/49827; H01L 23/49838;
(Continued)

(56) References Cited

U.S. PATENT DOCUMENTS

2007/0290310 A1* 12/2007 Kusano ............... H01L 23/4275
257/E23.079
2008/0316344 A1   12/2008 Yamamiya

FOREIGN PATENT DOCUMENTS

CN    101299433 A    11/2008
JP    10-41595 A    2/1998
(Continued)

OTHER PUBLICATIONS

International Search Report and Written Opinion of PCT Application No. PCT/JP2020/015778, issued on Jul. 7, 2020, 10 pages of ISRWO.

*Primary Examiner* — Elias Ullah
(74) *Attorney, Agent, or Firm* — CHIP LAW GROUP

(57) ABSTRACT

In a wired substrate, heat dissipation performance is improved while an increase in an amount of metal is inhibited.

The substrate includes a transmission line, an insulating material, and a heat storage material. In the substrate provided with the transmission line, the insulating material and the heat storage material, the transmission line transmits a predetermined electrical signal from a semiconductor chip. The transmission line for transmitting the predetermined electrical signal from the semiconductor chip is wired in the insulating material. The heat storage material has a higher thermal conductivity than the insulating material to which the transmission line is wired and accumulates latent heat accompanying phase transition that occurs within an operating temperature range of the semiconductor chip.

11 Claims, 15 Drawing Sheets

(51) Int. Cl.
  *H01L 23/498* (2006.01)
  *H01L 23/66* (2006.01)
  *H01P 3/08* (2006.01)
  *H01P 11/00* (2006.01)
(52) U.S. Cl.
  CPC .. *H01L 23/49827* (2013.01); *H01L 23/49838* (2013.01); *H01P 3/08* (2013.01); *H01P 11/003* (2013.01); *H01L 2223/6616* (2013.01); *H01L 2223/6627* (2013.01)
(58) Field of Classification Search
  CPC ..... H01L 2223/6616; H01L 2223/6627; H01L 23/3677; H01L 23/4275; H01L 2224/32225; H01L 2224/48091; H01L 2224/48227; H01L 2224/48465; H01L 2224/73265; H01P 3/08; H01P 11/003; H05K 1/02; H05K 3/46
  See application file for complete search history.

(56) References Cited

FOREIGN PATENT DOCUMENTS

| | | | |
|---|---|---|---|
| JP | 2004-295704 | A | 10/2004 |
| JP | 2007-234731 | A | 9/2007 |
| JP | 2008-278330 | A | 11/2008 |
| JP | 2014-049604 | A | 3/2014 |
| JP | 2015-198319 | A | 11/2015 |
| JP | 2015-198484 | A | 11/2015 |

\* cited by examiner

Fig. 14

| COMPOSITION OF SOLDER RESIST |||
|---|---|---|
| CLASSIFICATION | NAME | WEIGHT% |
| RESIN | ACRYLATE BASED RESIN, MONOMER | 33.6 |
| | EPOXY RESIN | 10.7 |
| FILLER | VANADIUM SULFATE, SILICA | 23.0 |
| COLOR PIGMENT | PHTHALOCYANINE GREEN | 0.3 |
| CATALYST | AROMATIC CARBONYL COMPOUND, AMINE COMPOUND | 6.2 |
| ADDITIVE | ANTIFOAMING AND LEVELING AGENT | 1.2 |
| SOLVENT | ORGANIC SOLVENT | 25.0 |

SUBSTRATE, ELECTRONIC DEVICE, AND METHOD FOR MANUFACTURING SUBSTRATE

CROSS REFERENCE TO RELATED APPLICATIONS

This application is a U.S. National Phase of International Patent Application No. PCT/JP2020/015778 filed on Apr. 8, 2020, which claims priority benefit of Japanese Patent Application No. JP 2019-100900 filed in the Japan Patent Office on May 30, 2019. Each of the above-referenced applications is hereby incorporated herein by reference in its entirety.

TECHNICAL FIELD

The present technique relates a substrate. More specifically, the present technique relates to a substrate on which a semiconductor chip is mounted, an electronic device, and a method for manufacturing a substrate.

BACKGROUND ART

In recent years, the performance of electronic devices has improved, and along with this, an amount of heat generated by electronic devices during operation has tended to increase. As the amount of heat generated increases, there is an increasing likelihood that adverse effects such as thermal runaway of a mounted circuit and warpage of a substrate will occur. Thus, for example, an electronic device in which an area of a conductive pattern, which is a wiring pattern on a substrate, is increased, and the conductive pattern is caused to function as a heat sink has been proposed (see, for example, PTL 1).

CITATION LIST

Patent Literature

[PTL 1]
JP 2014-049604 A

SUMMARY

Technical Problem

In the above-mentioned conventional technique, heat dissipation performance is improved by increasing the area of the conductive pattern. However, when the area of the conductive pattern (wiring) is increased, an amount of metal constituting the wiring may be increased, and power consumption and a weight of the device may be increased due to the increase in the amount of metal. If the amount of metal is reduced in order to inhibit the increase in power consumption and weight, the heat dissipation performance will be degraded. As described above, in the above-mentioned device, it is difficult to improve the heat dissipation performance while inhibiting increase in the amount of metal.

The present technique has been devised in view of such circumstances and an object thereof is to improve heat dissipation performance while inhibiting an increase in an amount of metal in a wired substrate.

Solution to Problem

The present technique has been made to solve the above-mentioned problems, and a first aspect thereof is a substrate including: a transmission line configured to transmit a predetermined electrical signal from a semiconductor chip; an insulating material to which the transmission line is wired; and a heat storage material that has a higher thermal conductivity than the insulating material and accumulates latent heat accompanying phase transition that occurs within an operating temperature range of the semiconductor chip. This causes the effect that the heat generated by the semiconductor chip is absorbed by the heat storage material.

Also, in the first aspect, the substrate may include a flexible substrate, the transmission line may be wired to a base layer, and the base layer may include the insulating material. This causes the effect that the heat generated by the semiconductor chip mounted on the flexible substrate is absorbed by the heat storage material.

Also, in the first aspect, the substrate may include a rigid substrate, and the transmission line may be wired to a wiring layer in which a core material and a prepreg are disposed. This causes the effect that the heat generated by the semiconductor chip mounted on the rigid substrate is absorbed by the heat storage material.

Also, in the first aspect, the heat storage material may further be disposed on the wiring layer, and the core material and the prepreg may include the insulating material. This causes the effect that the heat is absorbed in the heat storage material that is disposed separately from the core material and the prepreg.

Also, in the first aspect, the prepreg may include the insulating material and the heat storage material. This causes the effect that the heat is absorbed in the prepreg.

Also, in the first aspect, the core material may include the insulating material and the heat storage material. This causes the effect that the heat is absorbed in the core material.

Also, in the first aspect, a solder resist configured to cover a surface of the substrate may further be provided, and the solder resist may include the heat storage material. This causes the effect that the heat is absorbed in the solder resist.

Also, a second aspect of the present technique is an electronic device including: a semiconductor chip; a transmission line configured to transmit a predetermined electrical signal from the semiconductor chip; an insulating material to which the transmission line is wired; and a heat storage material that has a higher thermal conductivity than the insulating material and accumulates latent heat accompanying phase transition that occurs within an operating temperature range of the semiconductor chip. This causes the effect that the heat generated by the semiconductor chip mounted on the substrate is absorbed by the heat storage material.

Also, a third aspect of the present technique is a method for manufacturing a substrate, the method including: a heat storage material disposing procedure of disposing a heat storage material that has a higher thermal conductivity than an insulating material and accompanies phase transition that occurs within an operating temperature range of a semiconductor chip; and a wiring procedure of wiring a transmission line configured to transmit a predetermined electrical signal from the semiconductor chip to the insulating material. This causes the effect that the substrate on which the heat storage material that absorbs the heat generated by the semiconductor chip is disposed is manufactured.

Also, in the third aspect, in the wiring procedure, the transmission line may be wired to a wiring layer in which a core material and a prepreg are disposed, and in the heat storage material disposing procedure, the heat storage material may further be disposed on the wiring layer. This causes the effect that the heat is absorbed in the heat storage material that is disposed separately from the core material and the prepreg.

Also, in the third aspect, a coating procedure of coating a surface of the substrate with a solder resist may further be provided, at least one of the solder resist, the core material, and the prepreg may include the heat storage material, the core material and the prepreg may include the insulating material, and in the heat storage material disposing procedure, at least one of the solder resist, the core material, and the prepreg may be disposed, and in the wiring procedure, the transmission line may be wired to the wiring layer in which the core material and the prepreg are disposed. This causes the effect that the heat is absorbed in at least one of the core material, the prepreg, and the solder resist.

BRIEF DESCRIPTION OF THE DRAWINGS

FIG. 14 is a diagram showing an example of a composition of a solder resist according to the third embodiment of the present technique.

DESCRIPTION OF EMBODIMENTS

Hereinafter, aspects for implementing the present technique (hereinafter referred to as embodiments) will be described. The description will be made in the following order.

1. First embodiment (example in which heat storage material is disposed in rigid substrate)
2. Second embodiment (example in which heat storage material is disposed in flexible substrate)
3. Third embodiment (example in which core material or the like including heat storage material is disposed in rigid substrate)

1. First Embodiment

[Configuration Example of Electronic Device]

Figure 1:
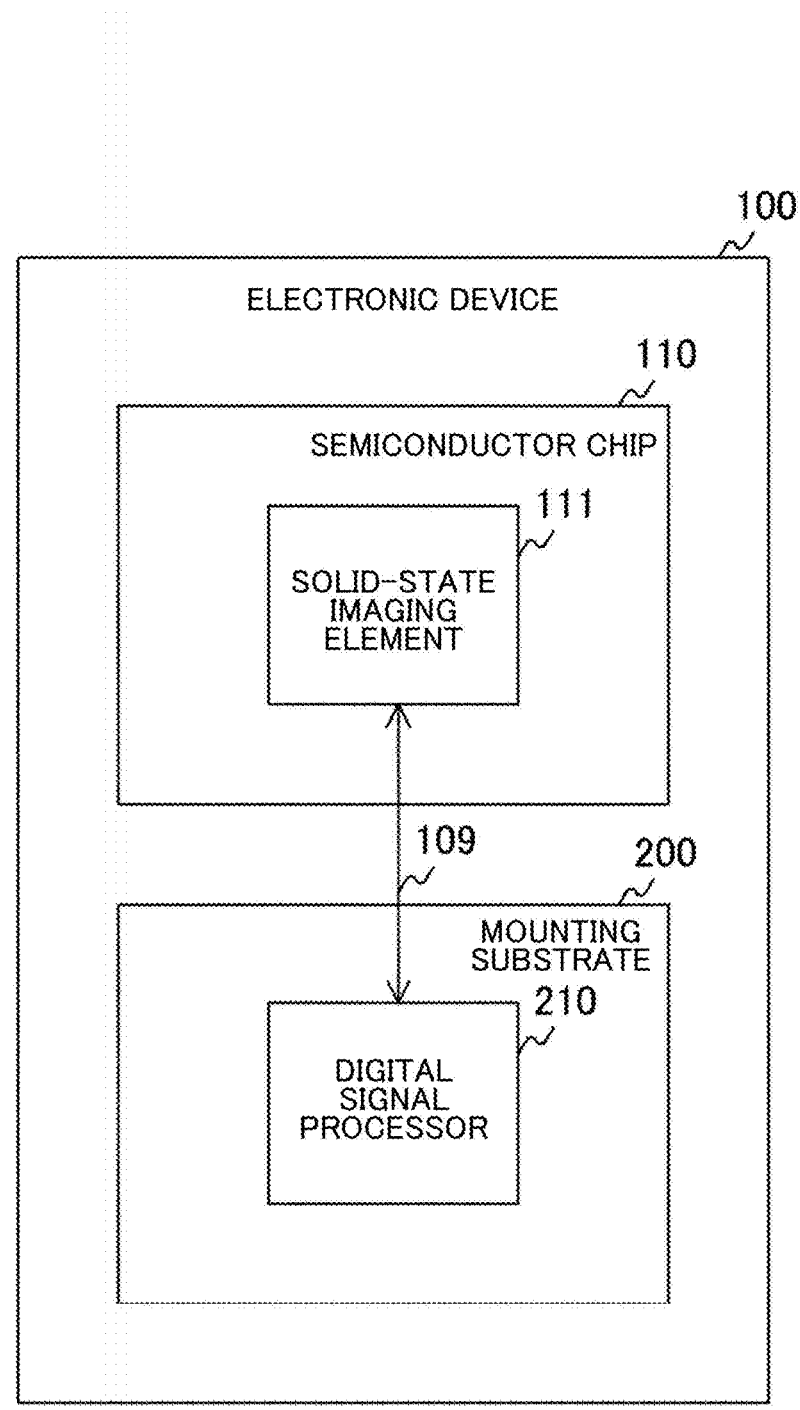
FIG. 1 is a block diagram showing a configuration example of an electronic device according to a first embodiment of the present technique.

FIG. 1 is a diagram showing a configuration example of an electronic device 100 according to a first embodiment of the present technique. This electronic device 100 includes a semiconductor chip 110 and a mounting substrate 200.

The semiconductor chip 110 includes a solid-state imaging element 111, external terminals (not shown), and the like. The solid-state imaging element 111 captures image data by photoelectric conversion. For the solid-state imaging element 111, for example, a complementary metal oxide semiconductor (CMOS) imaging element or the like is used. Also, although the solid-state imaging element 111 is disposed in the semiconductor chip 110, the present technique is not limited to this configuration, and a semiconductor integrated circuit other than the solid-state imaging element 111 can be disposed.

The mounting substrate 200 is a rigid substrate on which the semiconductor chip 110 is mounted and includes various circuits such as a digital signal processor 210. The digital signal processor 210 performs predetermined signal processing on the image data. This digital signal processor 210 exchanges the image data and control signals with the solid-state imaging element 111 via a signal line 109. Also, although the digital signal processor 210 is disposed in the mounting substrate 200, the present technique is not limited to this configuration, and a circuit other than the digital signal processor 210 can be disposed.

Figure 2:
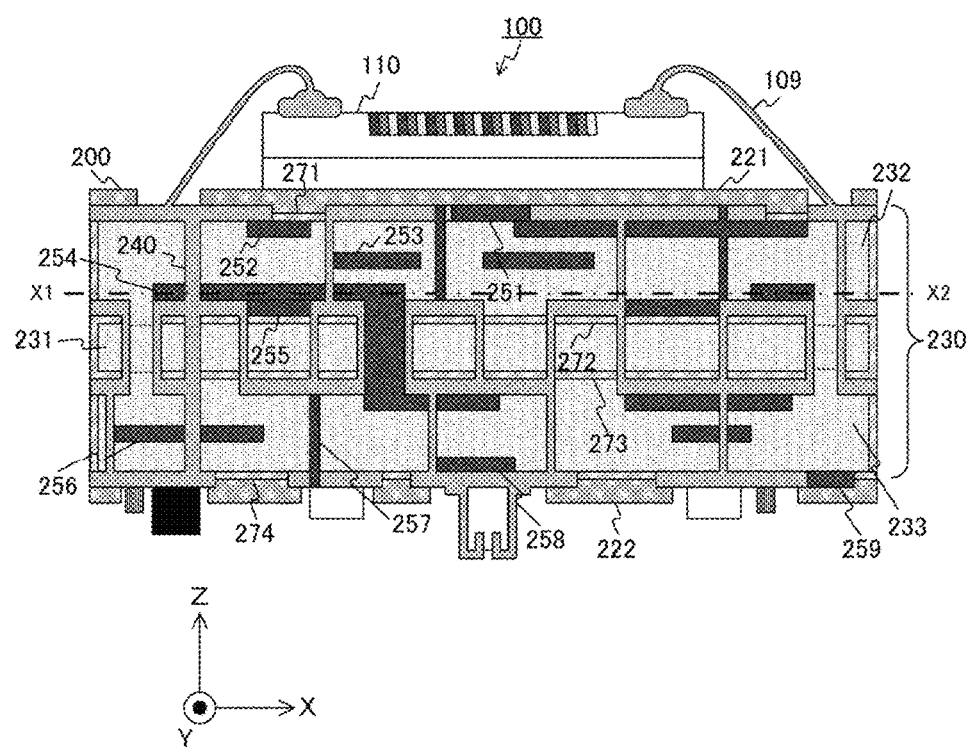
FIG. 2 is an example of a cross-sectional view of the electronic device according to the first embodiment of the present technique.

FIG. 2 is an example of a cross-sectional view of the electronic device 100 according to the first embodiment of the present technique. The semiconductor chip 110 is mounted on one of both surfaces of the mounting substrate 200 by wire bonding. Hereinafter, a surface on which the semiconductor chip 110 is mounted is referred to as a "front surface," and a surface on which the semiconductor chip 110 is not mounted is referred to as a "back surface." Also, mounting of the semiconductor chip 110 is not limited to the wire bonding, and for example, flip chip mounting can also be used. In addition, components other than the semiconductor chip 110 can further be mounted.

Further, a predetermined direction parallel to the front surface of the mounting substrate is defined as an "X direction," and a direction perpendicular to the front surface is defined as a "Z direction." A direction perpendicular to the X and Z directions is defined as a "Y direction." The figure is a cross-sectional view seen in the Y direction.

Also, the front surface of the mounting substrate 200 is coated with a solder resist 221 and the back surface of the mounting substrate 200 is coated with a solder resist 222.

Further, the mounting substrate 200 includes a wiring layer 230 to which a signal line 240 is wired. The wiring layer 230 includes a core material 231, prepregs 232 and 233, the signal line 240, heat storage materials 251 to 259, and copper foils 271 to 274.

The core material 231 is a member disposed in the vicinity of a center of the mounting substrate 200 and includes an insulating material. The copper foils 272 and 273 are laminated on both surfaces of the core material 231.

The prepregs 232 and 233 are members for connecting copper foils such as the copper foils 271 to 274 and include insulating materials. For the prepregs 232 and 233, for example, members obtained by impregnating a glass cloth, which is a covering made of glass, with a resin called resin and covering its top and bottom with a thin resin are used. The prepreg 232 is disposed between the copper foil 271 and the copper foil 272 above the core material 231 with a direction toward the front surface of the mounting substrate 200 set as an upward direction. On the other hand, the prepreg 233 is disposed between the copper foil 273 and the copper foil 274 below the core material 231.

As described above, in the mounting substrate 200, the solder resist 221, the copper foil 271, the prepreg 232, the copper foil 272, the core material 231, the copper foil 273, the prepreg 233, the copper foil 274, and the solder resist 222 are laminated in order from a top thereof. The substrate in which copper foils are applied to a laminated board on which prepregs are stacked in this way is called a copper-clad laminated board.

Further, the signal line 240 is connected to the semiconductor chip 110 via the signal line 109, and is also connected to the copper foil 271 or the like. In addition, a portion of the signal line 240 extending in the Z direction is called a via. This signal line 240 and the copper foils 271 to 274 are used as a transmission line for transmitting a predetermined electrical signal (image data or the like) from the semiconductor chip 110. Various circuits such as the digital signal processor 210 are formed by this transmission line. Also, the signal line 240 and the copper foils 271 to 274 are an example of the transmission line described in the claims.

Further, the heat storage materials 251 to 259 are embedded in the wiring layer 230. These heat storage materials 251 to 259 are members that have higher thermal conductivities than the insulating materials constituting the core material 231 and the prepregs 232 and 233 and accumulate latent heat accompanying phase transition that occurs within an operating temperature range of the semiconductor chip 110. The heat storage material that accumulates latent heat in this way is called a latent heat storage material.

Here, the latent heat is thermal energy generated or absorbed when phase transition of an object occurs without change in temperature of the object. In addition, the phase transition also means, in addition to a change of state between a gas, a liquid and a solid, a change of physical properties (crystal structure, density, magnetism, etc.) or a change of ground state of a substance in the same phase. This phase transition is also called a phase change.

Further, shapes and sizes of the heat storage materials 251 to 259 are arbitrary. The heat storage material 251 is disposed directly below the solder resist 221 and the heat storage material 259 is disposed directly above the solder resist 222. The heat storage materials 252 to 258 are disposed in a region in which at least some of the heat storage materials 252 to 258 comes into contact with the transmission line (signal line 240 or the like). Further, a part of the heat storage material 254 is filled into a through hole extending in the Z direction. This part can be called a thermal via.

For the heat storage material 251 and the like, vanadium oxides, paraffin-based heat storage materials, phase change material (PCM) sheets, or the like are used. Their thermal conductivities are, for example, 10 to 250 watts per meter Kelvin (W/m·K). Also, the latent heat is, for example, 50 to 510 joules per gram (J/g). The heat storage materials such as vanadium oxides are used for heating and cooling houses and for keeping warm and cold during transportation.

Vanadium oxides are solid at room temperature, are relatively easy to handle if powdered, and have greater latent heat than a paraffin-based heat storage material. On the other hand, vanadium oxides have a higher density than a paraffin-based heat storage material, and in a case in which they is disposed on the mounting substrate 200, insulation is required depending on a location. Further, the paraffin-based heat storage material changes from a solid to a gel state at a high temperature such as 80° C. or higher, but if it is encapsulated in microcapsules, it can be easily handled. In addition, the paraffin-based heat storage material encapsulated in a microcapsule is also called a thermomemory.

Further, a material of the transmission line (the signal line 240, the copper foil 271, etc.) is a metal such as copper, and a material of the insulating materials constituting the core material 231 and the prepregs 232 and 233 is glass or a resin. These metals, glass, and resin do not undergo phase transition within a general operating temperature range of the semiconductor chip 110, and within that temperature range, sensible heat is generated instead of latent heat. Sensible heat is thermal energy generated or absorbed when a temperature of an object changes without phase transition.

In summary of the above-mentioned configuration, in the mounting substrate 200 which is a rigid substrate, the transmission line such as the signal line 240 and the copper foil 271 are wired in the wiring layer 230 in which the prepreg 232 and the core material 231 including the insulating materials are disposed. This transmission line transmits an electrical signal from the semiconductor chip 110. Further, the heat storage materials 251 to 259 that have higher thermal conductivities than the insulating materials and accumulate latent heat accompanying phase transition that occurs within the operating temperature range of the semiconductor chip 110 are further disposed in the wiring layer 230. With this configuration, the heat generated in the semiconductor chip 110 is conducted to the heat storage material 251 and the like via the transmission line and absorbed.

Figure 3:
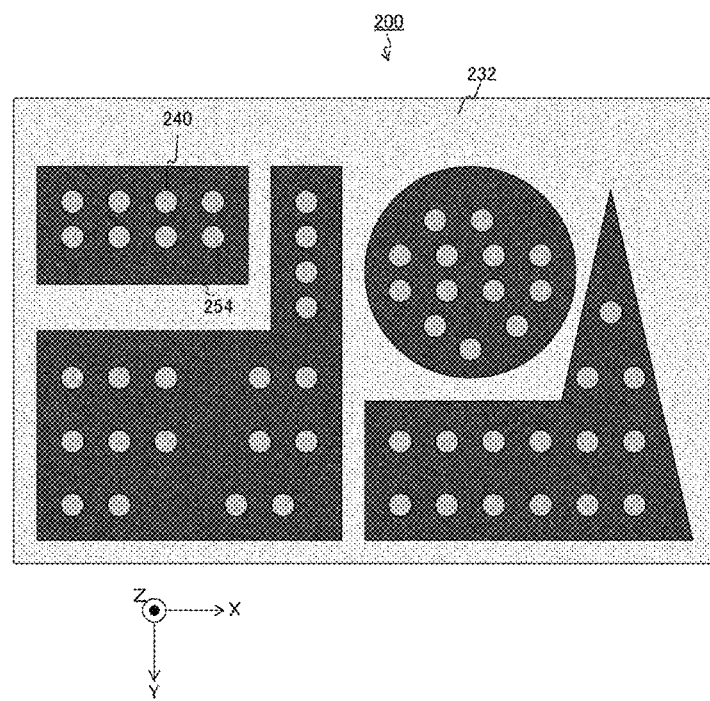
FIG. 3 is an example of a cross-sectional view of a wiring layer according to the first embodiment of the present technique.

FIG. 3 is an example of a cross-sectional view of the wiring layer according to the first embodiment of the present technique. FIG. 3 is an example of a cross-sectional view of the wiring layer 230 taken along line segment X1-X2 in FIG. 2 and viewed in the Z direction. As illustrated in FIG. 3, in the prepreg 232 and the like, a via that functions as the signal line 240 is wired, and the heat storage material 254 is embedded in a region in which at least a part is in contact with the signal line 240 (for example, a region surrounding the signal line 240).

Figure 4:
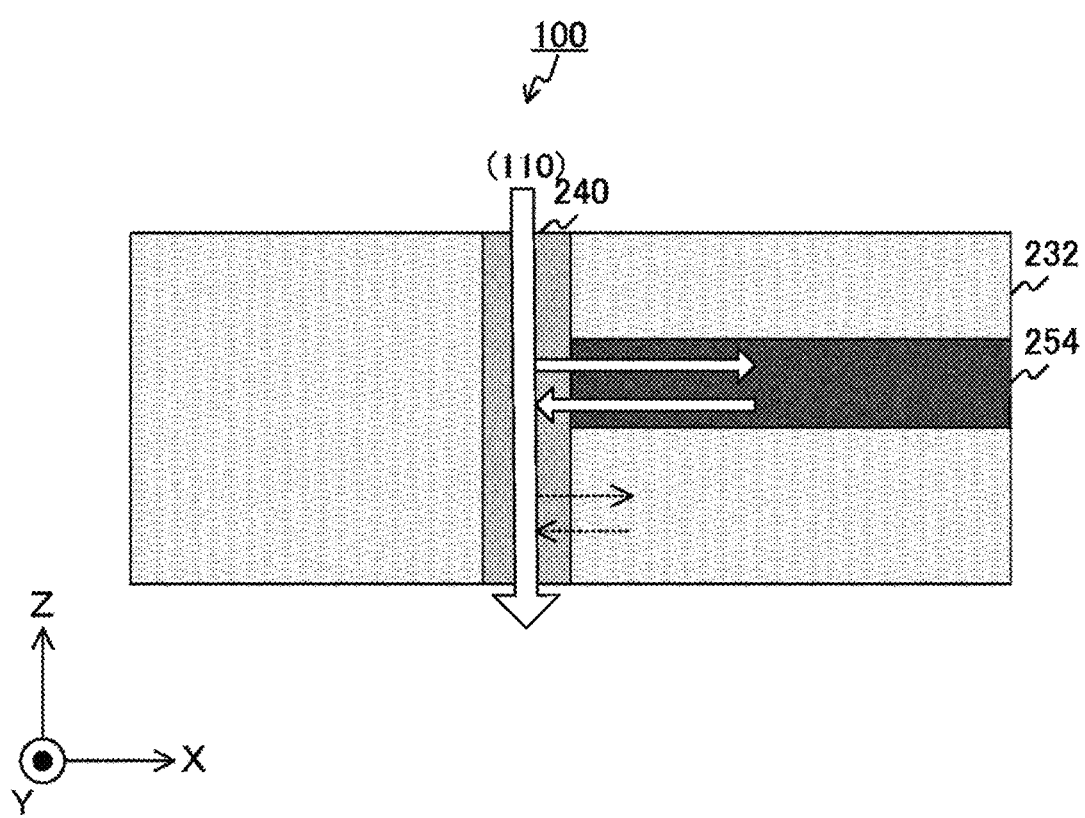
FIG. 4 is a diagram for explaining heat dissipation performance of the first embodiment of the present technique.
Figure 5A:
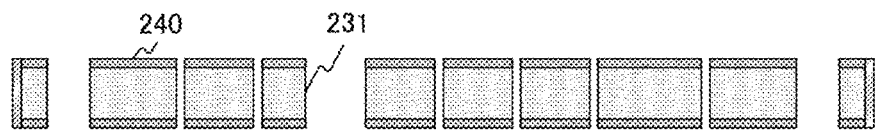
FIGS. 5A, 5B, 5C, and 5D are diagrams for explaining a process until desmearing according to the first embodiment of the present technique.
Figure 5B:
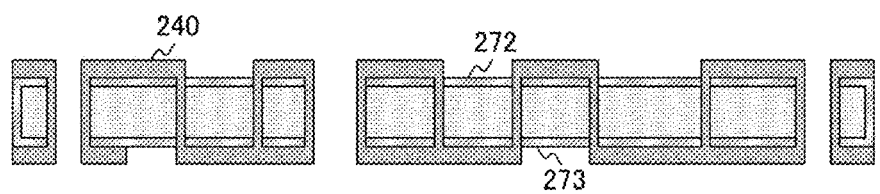
Figure 5C:
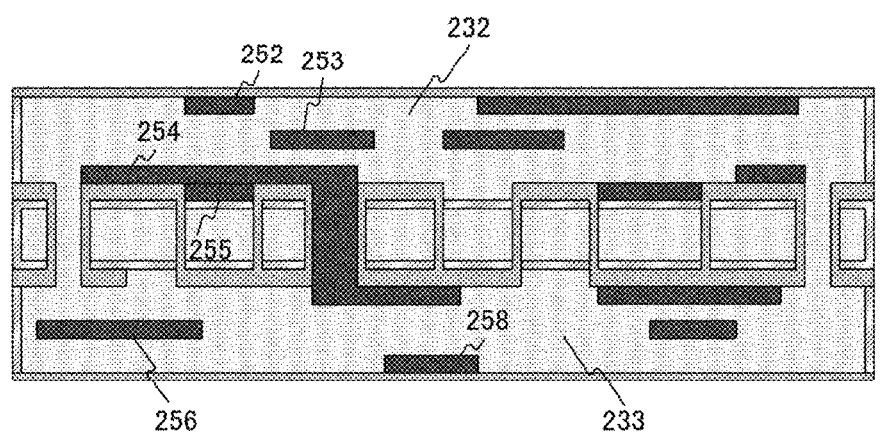
Figure 5D:
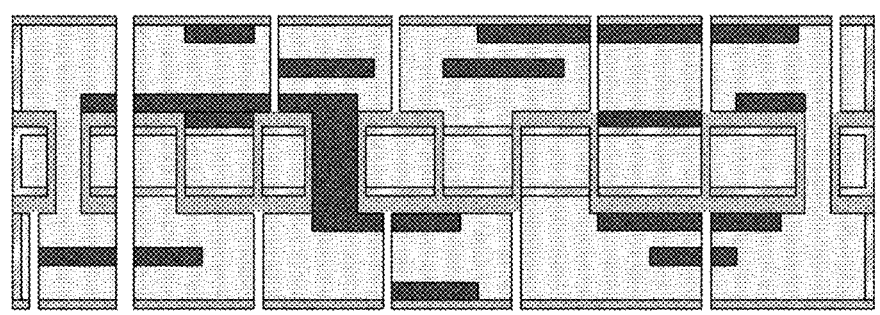

FIG. 4 is a diagram for explaining heat dissipation performance of the first embodiment of the present technique. Arrows in the figure indicate directions in which heat conducts. As illustrated in the figure, when heat is generated in the semiconductor chip 110, the transmission line such as the signal line 240 conducts the heat. As described above, the thermal conductivity of the heat storage material (251, etc.) is higher than those of the insulating materials. For this reason, most of the heat is conducted from the transmission line to the heat storage materials.

Further, the heat storage materials undergo phase transition within the operating temperature range of the semiconductor chip 110, and the latent heat accompanying the phase transition is accumulated. In other words, the heat storage materials absorb thermal energy corresponding to the latent heat. Also, the thermal energy absorbed by the heat storage materials is released to the back surface side of the mounting substrate 200 via the transmission line with the elapse of time.

As described above, the heat generated in the semiconductor chip 110 is conducted from the transmission line to the heat storage materials, and the heat storage materials absorb the heat during the phase transition, and thus an amount of heat radiated from the semiconductor chip 110 increases as compared with a case in which the heat storage materials are not provided. As a result, it is possible to inhibit a temperature rise of the semiconductor chip 110 and prevent thermal runaway of the semiconductor chip 110 due to the temperature rise.

Also, since the heat storage materials absorb the heat during the phase transition without the temperature being raised, a temperature rise of the mounting substrate 200 can be inhibited as compared with the case in which the heat storage materials are not provided. Further, by disposing the heat storage materials in a dispersed manner in the mounting substrate 200, a heat distribution of the mounting substrate 200 can be made uniform and an internal stress can be relaxed at the time of thermal expansion. By inhibiting the temperature rise and making the heat distribution uniform, it is possible to prevent the mounting substrate 200 from being warped due to the temperature rise. By preventing warpage, deterioration of imaging characteristics of the solid-state imaging element 111 can be inhibited. In particular, as a size of the solid-state imaging element 111 increases, the effect of inhibiting deterioration of imaging characteristics increases.

By increasing a volume and an area of a metal (copper or the like) transmission line (signal line 240 or the like), an amount of heat dissipated from the semiconductor chip 110 can also be increased. However, as an amount of metal constituting the transmission line increases, a leakage current increases, which may increase power consumption and weight. For this reason, it is not preferable to increase the number of transmission lines.

The heat storage materials are thinner and lighter than the metal constituting the transmission line, and thus by improving the heat dissipation performance with the heat storage materials, it is possible to easily reduce a density of the wiring, and a size and a weight of the imaging element.

[Method for Manufacturing Mounting Substrate]

FIGS. 5A, 5B, 5C, and 5D are diagrams for explaining a process until desmearing according to the first embodiment of the present technique. In the figure, a is a diagram for explaining a process of forming through holes, and in the figure, b is a diagram for explaining processes of copper-plating and forming an inner layer circuit. In the figure, c is a diagram for explaining processes of forming the heat storage materials and lamination pressing, and in the figure, d is a diagram for explaining a process from drilling to desmearing.

As illustrated in a of the figure, a manufacturing system forms through holes for conduction in an inner layer (that is, the core material 231) by drilling or laser machining.

Next, as illustrated in b of the figure, the manufacturing system performs copper-plating on an inner wall of the through hole and a front surface of the core material 231 to form an inner layer circuit.

Subsequently, as illustrated in c of the figure, the prepregs 232 and 233 are laminated, and the heat storage material 252 and the like are disposed inside them, on upper surfaces and lower surfaces thereof. Then, the manufacturing system melts and cures the laminated resins of the prepregs 232 and 233 by thermocompression bonding to prepare a multilayer substrate.

Here, as a method for forming the heat storage materials, an appropriate method is selected in accordance with a type of the heat storage materials. In the case of using vanadium oxides or paraffin-based heat storage materials, the manufacturing system mixes their microcapsules and powders with an epoxy resin or the like, prints and applies it to a circuit surface, the prepreg 232, or the like with a screen printing machine or a dispenser, and cures the resin. In addition to applying and printing, when a lay-up is performed at the time of laminating the prepregs 232 and 233, the heat storage materials are sandwiched between the prepreg 232 and the like, or overlapped on the upper and lower surfaces thereof, and thus they can be formed at arbitrary positions. In this case, the manufacturing system may prepare a flexible PCM sheet as a heat storage material, cut it into an arbitrary shape using a cutter, a hollow, or the like, and dispose it on the circuit surface, above, below and in the middle of the prepreg 232 and the like in the lay-up of the laminating process.

Then, as illustrated in d of the figure, the manufacturing system forms through holes and non-through holes in the laminated substrate by drilling or laser processing. The manufacturing system cleans the inside of the holes by performing a process of dissolving and removing unnecessary deposits (that is, desmearing) such as a resin remaining inside the holes formed in the laminated substrate with a plasma, a chemical solution, or the like.

Figure 6A:
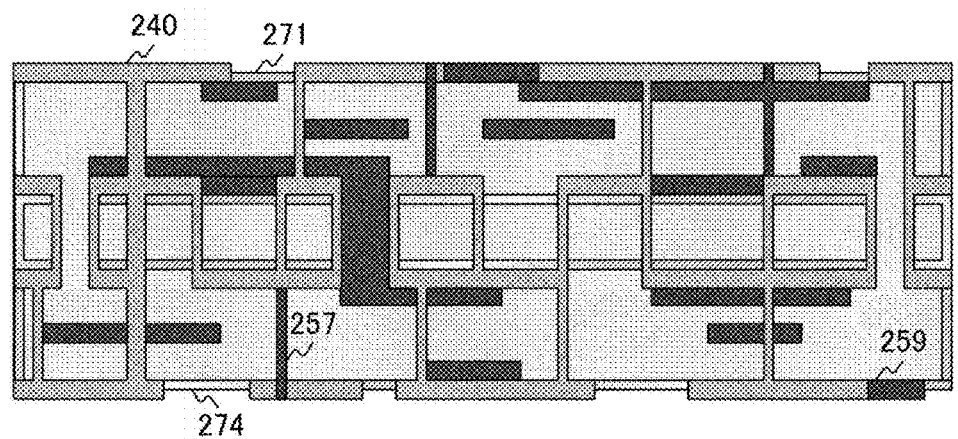
FIGS. 6A and 6B are diagrams for explaining a process until visual inspection according to the first embodiment of the present technique.
Figure 6B:
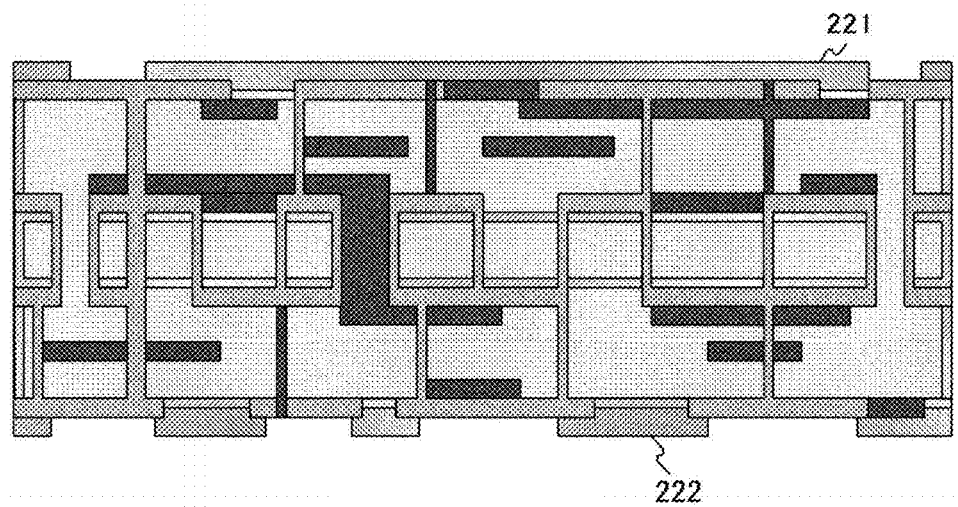

FIGS. 6A and 6B are diagrams for explaining a process until visual inspection according to the first embodiment of the present technique. In the figure, a is a diagram for explaining a process from formation of an outer layer circuit to formation of the heat storage materials, and in the figure, b is a diagram for explaining a process from formation of the solder resists to visual inspection.

As illustrated in a of the figure, the manufacturing system performs copper-plating on the holes formed in the laminated substrate and outer layers (the prepregs 232 and 233, etc.) of the laminated substrate and electrically connects the copper-plated portions to the inner layer circuit. Then, the manufacturing system wires the signal line 240 to the outer layer by etching or an additive method to form the outer layer circuit. Subsequently, the manufacturing system disposes the heat storage material 257 and the like on the holes formed in the laminated substrate and the outer layer circuit. In a case in which the heat storage materials are formed, an appropriate method is selected in accordance with a type of the heat storage materials, and coating, printing, or the like is used. When they are disposed directly below or directly above the solder resists 221 and 222, coating, printing, laminating, pasting, or the like is used.

Then, as illustrated in b of the figure, the manufacturing system forms the solder resists 221 and 222 on the front surface and the back surface of the outer layer circuit. For a method for forming the solder resists 221 and 222, screen printing, roll coating, spray coating, or the like is used. In addition, the manufacturing system cures solder resist ink by thermosetting, ultra-violet (UV) curing, or the like.

The manufacturing system performs gold-plating on necessary lands for the purposes of wire bonding, soldering, formation of contacts and terminals, or the like. Also, if the purpose of wire bonding or the like can be achieved, processing other than gold-plating can be performed. Then, the manufacturing system performs outer shape processing on the laminated substrate to have a predetermined shape by router processing, outer shape pressing, or the like. In addition, the manufacturing system electrically inspects whether or not connections electrically necessary for circuits and conduction holes are performed, and whether there is a breakage or a short-circuit in the circuits. Finally, the manufacturing system visually inspects, using an inspection machine or the like, whether or not an appearance of the mounting substrate 200 is finished in accordance with standards. This visual inspection may be performed visually by an operator.

Figure 7:
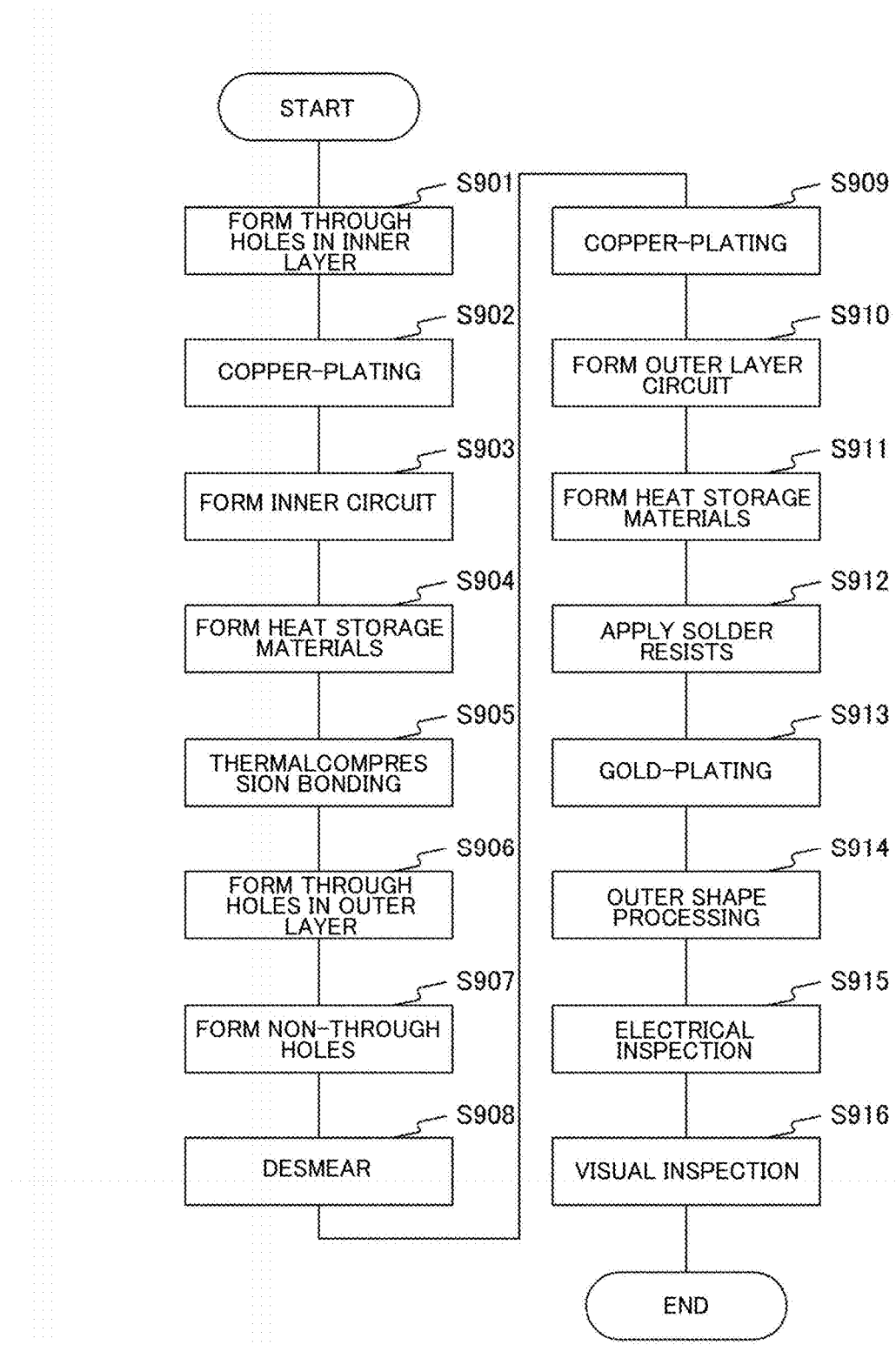
FIG. 7 is a flowchart showing an example of a method for manufacturing a mounting substrate according to the first embodiment of the present technique.

FIG. 7 is a flowchart showing an example of a method for manufacturing the mounting substrate 200 according to the first embodiment of the present technique. The manufacturing system forms the through holes for conduction in the inner layer (step S901). The manufacturing system performs copper-plating (step S902) to form the inner layer circuit (step S903). Then, the manufacturing system forms the heat storage materials (step S904), melts and cures the resins of the prepregs 232 and 233 by thermocompression bonding, and prepares the multilayer substrate (step S905).

Next, the manufacturing system forms the through holes and the non-through holes in the laminated substrate (steps S906 and S907) and performs desmearing (step S908). The manufacturing system performs copper-plating on the holes formed in the laminated substrate and the outer layer of the laminated substrate are (step S909) to form the outer layer circuit (step S910).

Subsequently, the manufacturing system forms the heat storage material 257 and the like on the holes formed in the laminated substrate and the outer layer circuit (step S911). The manufacturing system forms the solder resists 221 and 222 on the front and back surfaces of the outer layer circuit (step S912) and performs gold-plating on necessary lands (step S913). Also, if the purpose of wire bonding or the like can be achieved, processing other than gold-plating can be performed. Then, the manufacturing system performs outer shape processing on the laminated substrate (step S914). Further, the manufacturing system performs an electrical inspection (step S915) and a visual inspection (step S916). After step S916, the manufacturing system ends the manufacturing of the mounting substrate 200. Also, some of these manufacturing processes can be performed by an operator instead of the manufacturing system.

As described above, according to the first embodiment of the present technique, the heat storage material 251 and the like, which have higher thermal conductivities than the insulating materials and accumulate the latent heat accompanying the phase transition are disposed, and thus the heat generated in the semiconductor chip 110 can be conducted and absorbed by the heat storage material 251 and the like. As a result, the heat dissipation performance of the electronic device 100 can be improved while an increase in the amount of metal is inhibited.

2. Second Embodiment

In the first embodiment described above, a rigid substrate is used for the mounting substrate 200, but since the rigid substrate cannot be bent, three-dimensional wiring in the device may be difficult. The electronic device 100 of a second embodiment is different from that of the first embodiment in that the heat storage materials are disposed on a flexible substrate.

Figure 8:
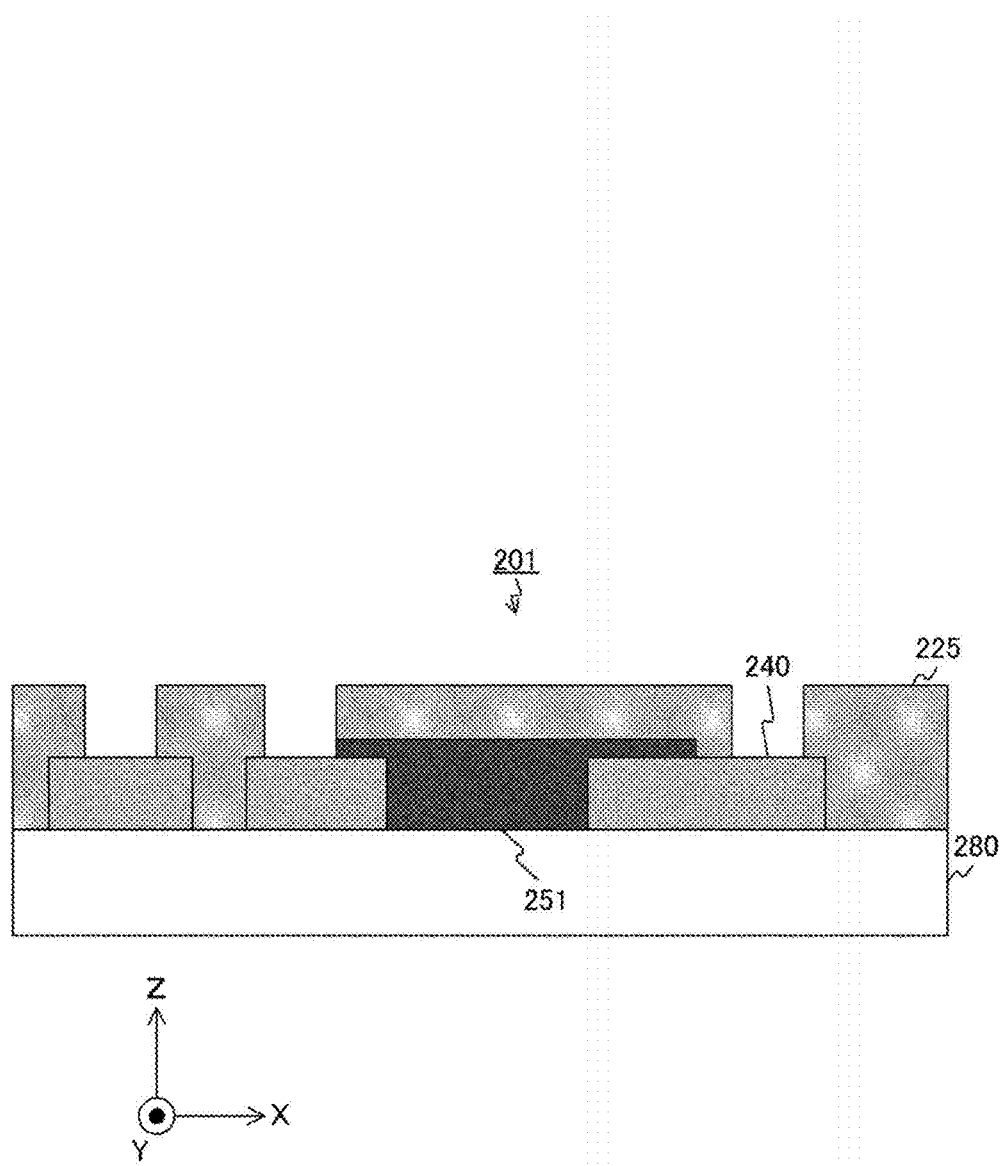
FIG. 8 is an example of a cross-sectional view of a mounting substrate according to a second embodiment of the present technique.

FIG. 8 is an example of a cross-sectional view of a mounting substrate 201 according to the second embodiment of the present technique. In the electronic device 100 of the second embodiment, the mounting substrate 201 is disposed instead of the mounting substrate 200. For the mounting substrate 201, a flexible substrate is used.

The mounting substrate 201 includes a cover lay 225, a heat storage material 251, a signal line 240, and a base layer 280. Also, although components such as the semiconductor chip 110 are mounted on the mounting substrate 201, the semiconductor chip 110 is omitted in the figure.

The base layer 280 is a thin film-shaped insulating material, and polyimide or the like is used. The base layer 280 is also called a base film. In the base layer 280, a signal line 240 is wired and a heat storage material 251 is disposed. A front surface of the base layer 280 is covered with the cover lay 225.

At the time of manufacturing the substrate, the manufacturing system forms a circuit formed by the signal line 240 on the base layer 280 and disposes the heat storage material 251 by pasting, printing or coating. Then, the manufacturing system performs thermocompression bonding of the cover lay 225. Further, a solder resist can be disposed instead of the cover lay 225.

Since the heat storage material 251 absorbs latent heat, it is possible to improve heat dissipation performance of components mounted on the mounting substrate 201 (that is, the flexible substrate) as in the first embodiment.

Also, although a flexible substrate is used for the mounting substrate 201, the present technique is not limited to this configuration. A flex rigid substrate formed by combining a flexible substrate with a rigid substrate can also be used for the mounting substrate. In the case of a flex rigid substrate, for example, the semiconductor chip 110 is mounted on the rigid substrate, and the heat storage material 251 and the signal line 240 are disposed on the flex substrate or the rigid substrate.

As described above, according to the second embodiment of the present technique, the heat storage material 251 is disposed on the flexible substrate, and thus when three-dimensional wiring is performed with the flexible substrate, heat dissipation performance of the substrate can be improved.

3. Third Embodiment

In the first embodiment described above, the manufacturing system has disposed the heat storage materials 251 to 259 in the wiring layer 230, but it is necessary to further carry out a process of disposing the heat storage material 251 and the like as compared with the case in which they are not disposed. A mounting substrate of a third embodiment is different from that of the first embodiment in that a process of forming the heat storage material is unnecessary.

Figure 9:
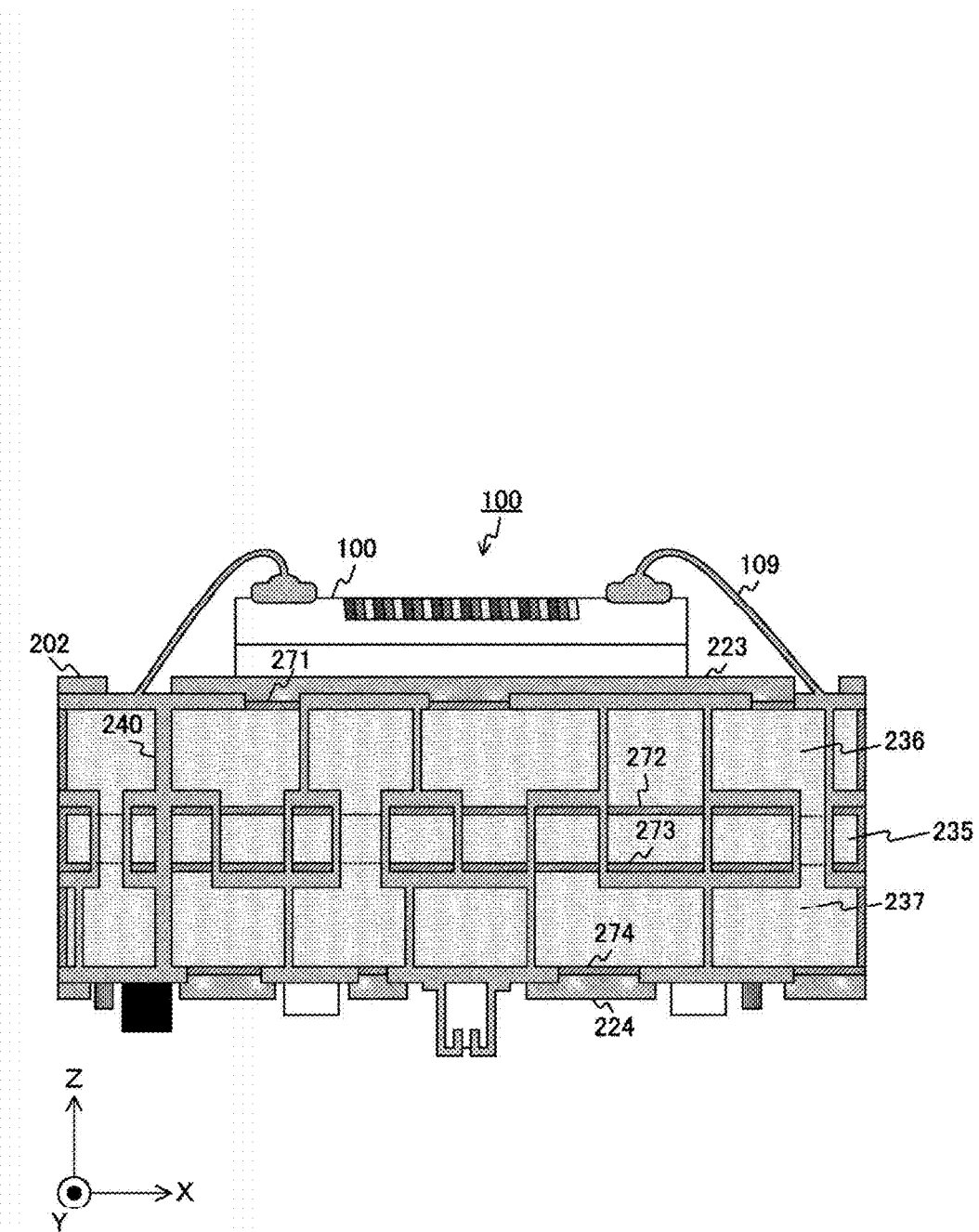
FIG. 9 is an example of a cross-sectional view of an electronic device according to a third embodiment of the present technique.

FIG. 9 is an example of a cross-sectional view of the electronic device 100 according to the third embodiment of the present technique. The electronic device 100 of the third embodiment is different from that of the first embodiment in that a mounting substrate 202 is provided instead of the mounting substrate 200.

The mounting substrate 202 includes solder resists 223 and 224 instead of the solder resists 221 and 222. Also, the mounting substrate 202 includes a core material 235 instead of the core material 231 and prepregs 236 and 237 instead of the prepregs 232 and 233.

The solder resists 223 and 224 are obtained by mixing a heat storage material with solder resist ink or the like. Further, the core material 235 and the prepregs 236 and 237 are obtained by mixing a heat storage material with an insulating material such as a varnish or a silane coupling material. That is, the solder resists 223 and 224, the core material 235, and the prepregs 236 and 237 further include a heat storage material in addition to the insulating material and the solder resist ink.

The solder resist ink used for the solder resists 223 and 224 includes a two-component type in which a main agent and a curing agent are mixed immediately before use and a one-component type in which the main agent and curing agent are already mixed by an ink manufacturer. Examples of a method for applying the solder resists 223 and 224 include screen printing, roll coating, spraying, and curtain coating. A viscosity of the ink is adjusted in accordance with the coating method. Specifically, the manufacturing system uses a stirrer to put the solder resist ink in a container and stirs the container while rotating the container with a spatula or the like in the container. In this case, microcapsules and powder of a heat storage material such as paraffin or vanadium oxide are added at the same time and mixed with the solder resist ink. As a result, the solder resists 223 and 224 having a heat storage function can be formed by using a normal solder resist manufacturing process.

The heat storage material mixed with the solder resist 223 and the like or the core material 235 and the like in the second embodiment has the same function as that of the first embodiment. That is, the heat storage material has a higher thermal conductivity than the insulating material and accumulates latent heat accompanying phase transition. For this reason, even in the second embodiment, the heat dissipation performance can be improved as in the first embodiment.

Figure 10:
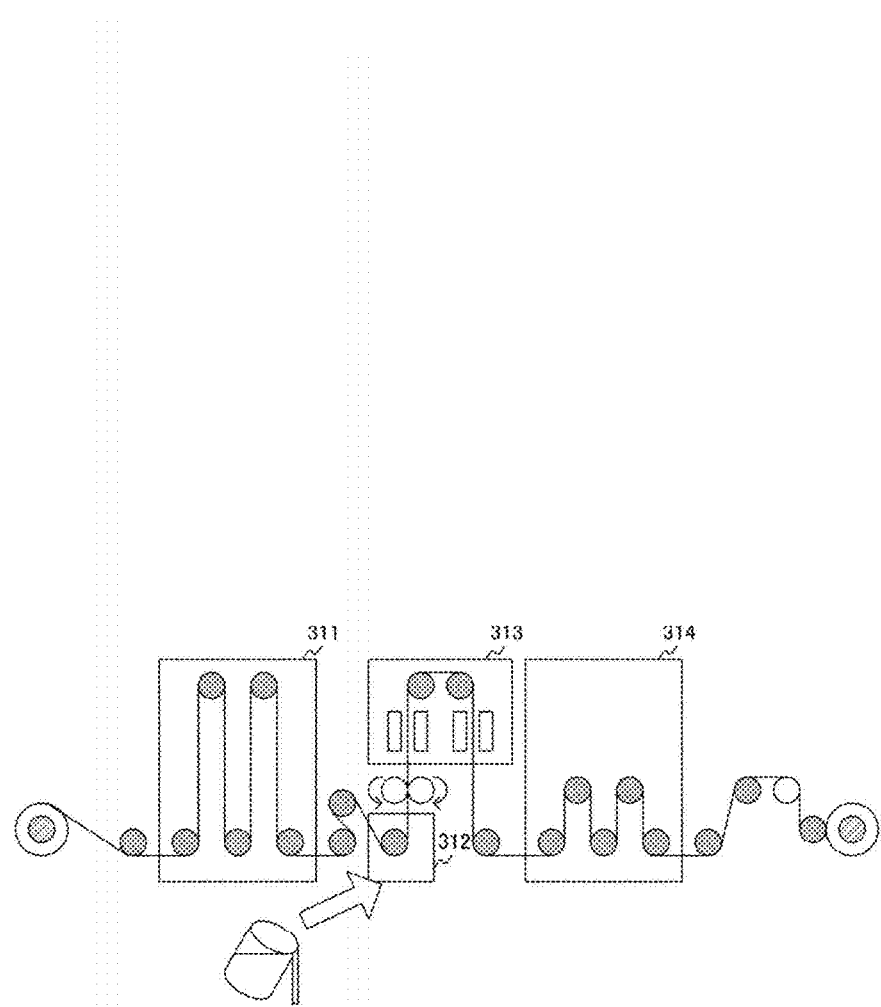
FIG. 10 is a diagram for explaining a method for manufacturing a glass cloth according to the third embodiment of the present technique.

FIG. 10 is a diagram for explaining a method for manufacturing a glass cloth according to the third embodiment of the present technique. The manufacturing system performs processes of warping and gluing, drawing, weaving and heat cleaning. These processes are omitted in the figure. Details of these processes are described in, for example, "*Seizo hoho* (Manufacturing method)," [online], Nitto Boseki Co., Ltd., [Search on Apr. 2, 2019], Internet (URL: https://www.nittobo.co.jp/business/glassfiber/about/process.htm)."

As illustrated in the figure, after heat cleaning, the manufacturing system performs secondary degreasing, transports glass fibers using an accumulator 311, and immerses them in a surface processing solution tank 312 containing a silane coupling material. Then, the manufacturing system heats the glass fibers in a heating furnace 313, transports them using an accumulator 314, and performs a processing to complete the glass cloth. In this process, the manufacturing system can mix the heat storage material with the silane coupling material in the surface processing solution tank 312.

FIGS. 11A, 11B, 11C, 11D, and 11E are diagrams for explaining a method for manufacturing the mounting substrate 202 according to the third embodiment of the present technique. In the figure, a is a diagram for explaining a manufacturing process of a varnish, and in the figure, b is a diagram for explaining a manufacturing process of prepregs. In the figure, c is a diagram for explaining a process of laminating copper foils, and in the figure, d is a diagram for explaining a process of heating and pressing using a pressing machine. In the figure, e is a diagram showing an example of a copper-clad laminate.

As illustrated in a of the figure, the manufacturing system manufactures the varnish by stirring a resin, a curing agent, or the like with a stirrer 321 or the like. In this process, the manufacturing system can further mix the heat storage material in addition to the resin and the like.

Next, as illustrated in b of the figure, the manufacturing system applies the varnish to the glass cloth, immerses it in an impregnated pad 322, and dries it with a heater 323. Then, the manufacturing system cuts the glass cloth into a sheet shape using a cutter 324 and laminates them. As a result, the prepregs 236 and 237 are manufactured. In this process, the manufacturing system can form the heat storage material on surfaces of the prepregs by roll coating, printing, or the like.

Subsequently, as illustrated in c of the figure, the manufacturing system superimposes the copper foils 271 and 272 on both surfaces of the prepregs.

As illustrated in d of the figure, the manufacturing system heats and pressurizes the prepregs on which the copper foils are laminated by the pressing machine 326. As a result, a copper-clad laminate can be manufactured as illustrated in e of the figure.

Figure 11A:
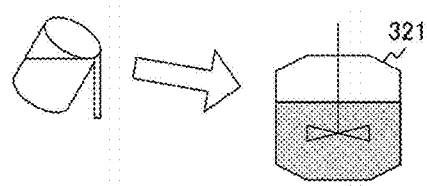
FIGS. 11A, 11B, 11C, 11D, and 11E are diagrams for explaining a method of manufacturing a mounting substrate according to the third embodiment of the present technique.
Figure 11B:
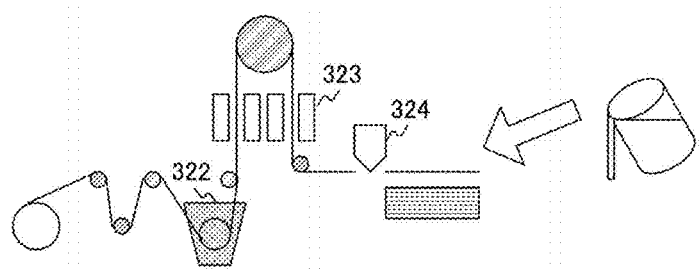
Figure 11C:
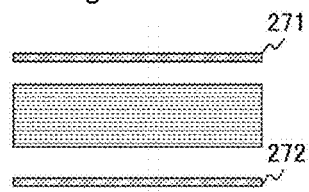
Figure 11D:
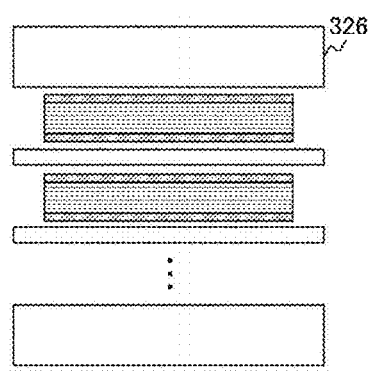
Figure 11E:
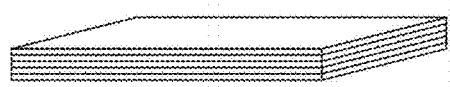

As illustrated in FIGS. 10, 11A, 11B, 11C, 11D, and 11E, the prepregs can be manufactured by mixing the heat storage material with the insulating material. Specifically, as illustrated in FIG. 10, the heat storage material can be mixed with the silane coupling material. Also, as illustrated in FIG. 11A, the heat storage material can be mixed with the varnish. As illustrated in FIG. 11B, the heat storage material can also be applied to surfaces of the dried prepregs. All of these three methods can be used, or only one or two can be used. Further, the core material can also be manufactured by the same method as that of the prepregs.

Also, the manufacturing system mixes the heat storage material with all of the core material, the prepregs, and the solder resists, but it is also possible to mix the heat storage material with only one or two of these.

Figure 12A:
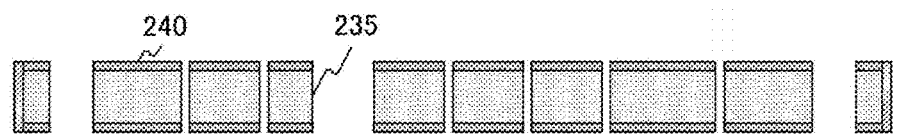
FIGS. 12A, 12B, and 12C are diagrams for explaining a process until formation of through holes according to the third embodiment of the present technique.
Figure 12B:
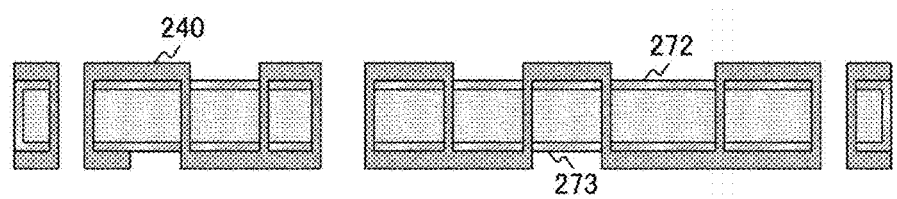
Figure 12C:
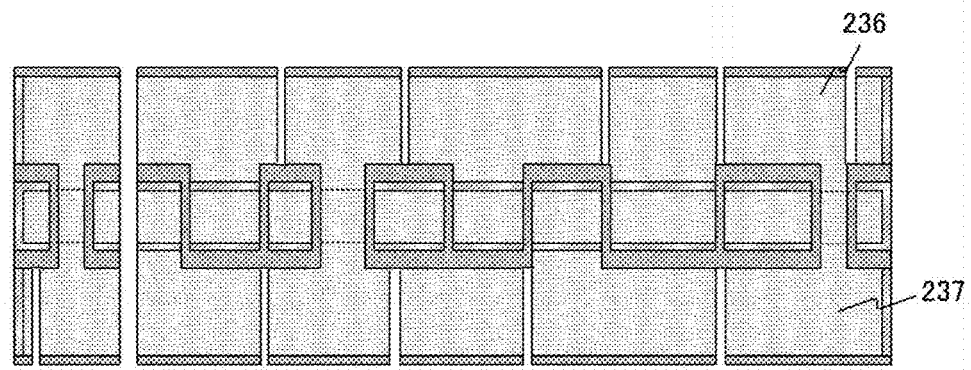

FIGS. 12A, 12B, and 12C are diagrams for explaining a process until formation of the through holes according to the third embodiment of the present technique. FIG. 12A is a diagram for explaining a process of forming the through holes, and FIG. 12B is a diagram for explaining processes of copper plating and forming the inner layer circuit. FIG. 12C is a diagram for explaining a process from formation of the heat storage material and lamination pressing to via processing.

As illustrated in a of the figure, the manufacturing system forms the through holes for conduction in the inner layer (core material 235) by drilling or laser machining.

Next, as illustrated in b of the figure, the manufacturing system performs copper-plating on inner walls of the through holes and a surface of the core material 235 to form the inner layer circuit.

Subsequently, as illustrated in c of the figure, the prepregs 236 and 237 are laminated, melted and cured by thermocompression bonding to prepare the multilayer substrate. Then, the manufacturing system forms the through holes and the non-through holes in the laminated substrate by drilling or laser machining.

The core material 235, the prepreg 236, and the like in the figure are manufactured by the manufacturing methods illustrated in FIGS. 10, 11A, 11B, 11C, 11D and 11E, and the heat storage material is mixed.

Figure 13A:
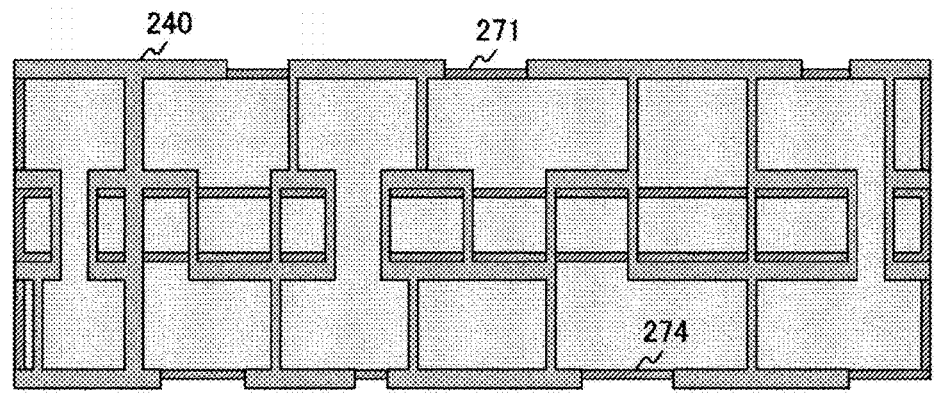
FIGS. 13A and 13B are diagrams for explaining a process until visual inspection according to the third embodiment of the present technique.
Figure 13B:
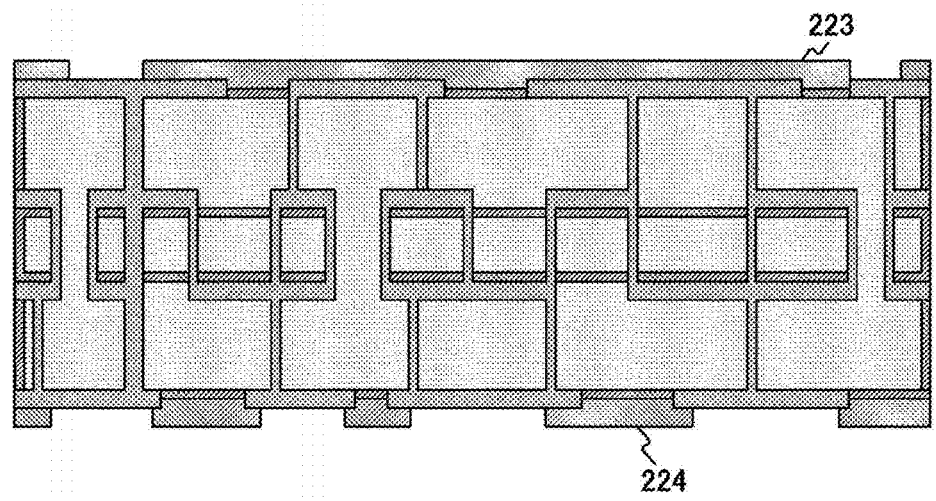

FIGS. 13A and 13B are diagrams for explaining a process until visual inspection of the third embodiment of the present technique. In the figure, a is a diagram for explaining a process from desmearing to formation of the outer layer circuit, and in the figure, b is a diagram for explaining a process from formation of the solder resists 223 and 224 to visual inspection.

As illustrated in a of the figure, the manufacturing system cleans the inside of the holes by performing a process of dissolving and removing unnecessary deposits (desmearing) such as a resin remaining inside the holes formed in the laminated substrate with a plasma, a chemical solution, or the like. Then, the manufacturing system performs copper-plating on the holes formed in the laminated substrate and the outer layer of the laminated substrate and electrically connects copper-plated portions to the inner layer circuit.

Then, the manufacturing system wires the signal line 240 to the outer layer by etching or an additive method to form the outer layer circuit.

Next, as illustrated in b of the figure, the manufacturing system forms the solder resists 223 and 224 on the front surface and the back surface of the outer layer circuit. The manufacturing system performs gold-plating on necessary lands for the purposes of wire bonding, soldering, formation of contacts and terminals, or the like. Also, if the purpose of wire bonding or the like can be achieved, processing other than gold-plating can be performed. Then, the manufacturing system performs outer shape processing on the laminated substrate to have a predetermined shape by router processing, outer shape pressing, or the like. In addition, the manufacturing system electrically inspects whether or not connections electrically necessary for circuits and conduction holes are performed. Finally, the manufacturing system inspects whether or not an appearance of the mounting substrate 202 is finished in accordance with standards using an inspection machine or the like.

FIG. 14 is a diagram showing an example of a composition of the solder resist according to the third embodiment of the present technique. As illustrated in the figure, the solder resist includes, for example, a resin, a filler, a color pigment, a catalyst, an additive, and a solvent. A proportion of a weight of the filler among these is about 20 to 25%. By adding microcapsules or powder of the heat storage material such as paraffin or vanadium oxide to the filler component, the solder resist ink itself can be imparted with a heat storage function. This makes it possible to manufacture the solder resists 223 and 224 that can store heat. Also, a particle size of the heat storage material added to the solder resist ink is preferably 2 micrometers (μm) or less.

Figure 15:
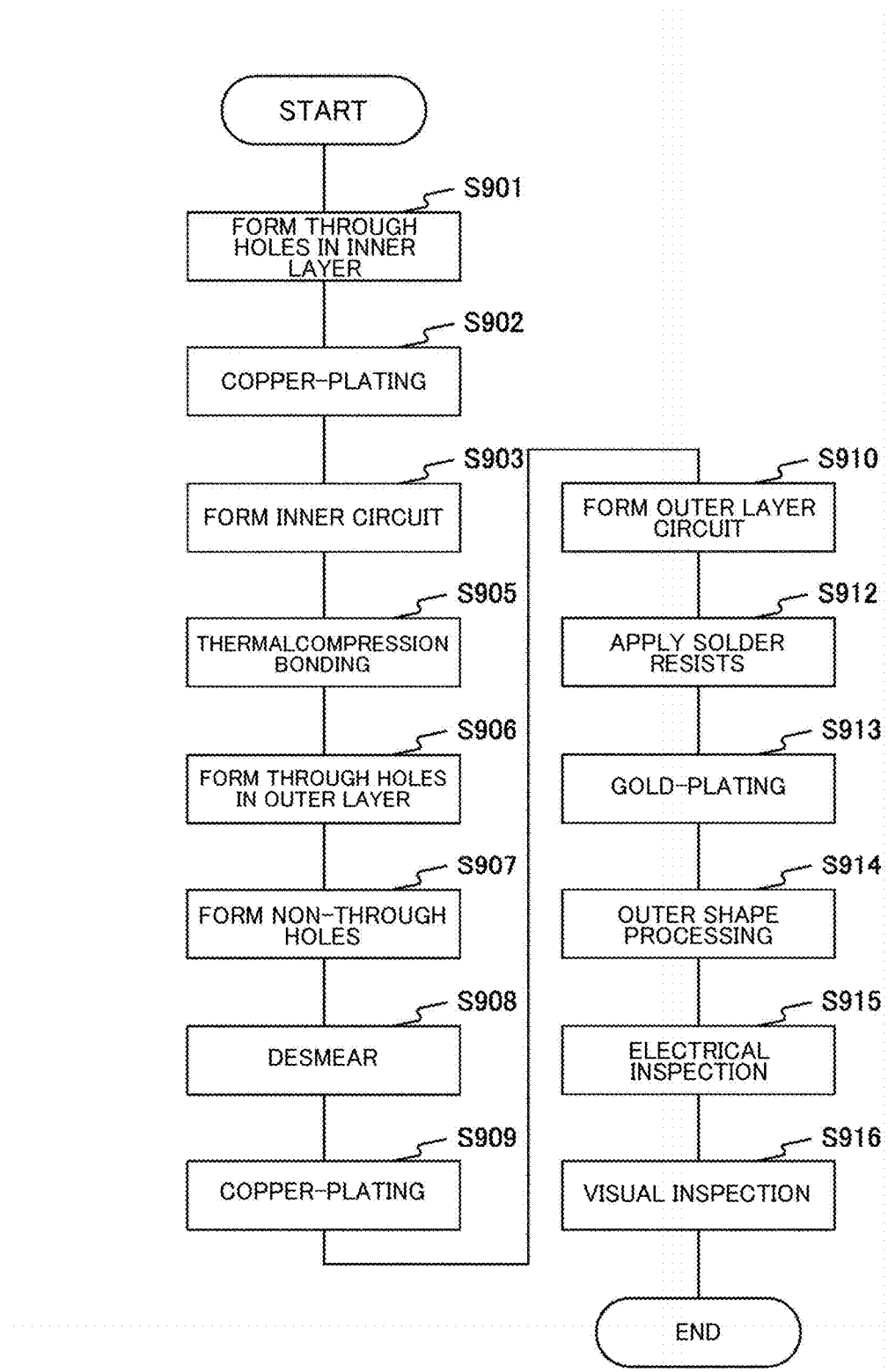
FIG. 15 is a flowchart showing an example of a method for manufacturing a mounting substrate according to the third embodiment of the present technique.

FIG. 15 is a flowchart showing an example of a method for manufacturing the mounting substrate 202 according to the third embodiment of the present technique. The manufacturing method of the third embodiment is different from the first embodiment in that the processes of forming the heat storage material (steps S904 and S911) are not executed. In the third embodiment, since the solder resist 223 and the like including the heat storage material are used, the processes of forming the heat storage material (step S904 or the like) can be reduced as compared with the first embodiment.

As described above, in the third embodiment of the present technique, the solder resist 223 and the like including the heat storage material, the core material 235 and the prepreg 236 and the like are disposed, and thus when the mounting substrate 202 is manufactured, the process of disposing the heat storage material becomes unnecessary. This makes it possible to simplify the manufacturing process of the mounting substrate 202.

Also, the above-described embodiments show examples for embodying the present technique, and matters in the embodiments and matters specifying the invention in the claims have a corresponding relationship with each other. Similarly, the matters specifying the invention in the claims and the matters in the embodiments of the present technique having the same name have a corresponding relationship with each other. However, the present technique is not limited to the embodiments and can be embodied by applying various modifications to the embodiments without departing from the gist thereof.

In addition, the effects described in the present specification are merely examples and are not intended as limiting, and other effects may be obtained.

Further, the present technique can have the following configurations.

(1) A substrate including:
 a transmission line configured to transmit a predetermined electrical signal from a semiconductor chip;
 an insulating material to which the transmission line is wired; and
 a heat storage material that has a higher thermal conductivity than the insulating material and accumulates latent heat accompanying phase transition that occurs within an operating temperature range of the semiconductor chip.

(2) The substrate according to the above (1),
 wherein the substrate includes a flexible substrate,
 the transmission line is wired to a base layer, and
 the base layer includes the insulating material.

(3) The substrate according to the above (1) or (2),
 wherein the substrate includes a rigid substrate, and
 the transmission line is wired to a wiring layer in which a core material and a prepreg are disposed.

(4) The substrate according to the above (3),
 wherein the heat storage material is further disposed on the wiring layer, and
 the core material and the prepreg include the insulating material.

(5) The substrate according to the above (3) or (4), wherein the prepreg includes the insulating material and the heat storage material.

(6) The substrate according to one of the above (3) to (5), wherein the core material includes the insulating material and the heat storage material.

(7) The substrate according to one of the above (3) to (6), further including a solder resist configured to cover a surface of the substrate, wherein the solder resist includes the heat storage material.

(8) An electronic device including:
 a semiconductor chip;
 a transmission line configured to transmit a predetermined electrical signal from the semiconductor chip;
 an insulating material to which the transmission line is wired; and
 a heat storage material that has a higher thermal conductivity than the insulating material and accumulates latent heat accompanying phase transition that occurs within an operating temperature range of the semiconductor chip.

(9) A method for manufacturing a substrate, the method including:
 disposing a heat storage material that has a higher thermal conductivity than an insulating material and accompanies phase transition that occurs within an operating temperature range of a semiconductor chip; and
 wiring a transmission line configured to transmit a predetermined electrical signal from the semiconductor chip to the insulating material.

(10) The method for manufacturing a substrate according to the above (9),
 wherein in the wiring, the transmission line is wired to a wiring layer in which a core material and a prepreg are disposed, and
 in the disposing of the heat storage material, the heat storage material is further disposed on the wiring layer.

(11) The method for manufacturing a substrate according to the above (9), further including coating a surface of the substrate with a solder resist,
 wherein at least one of the solder resist, the core material, and the prepreg contains the heat storage material, the core material and the prepreg include the insulating material, in the disposing of the heat storage material, at least one of the solder resist, the core material, and the prepreg is disposed, and in the wiring, the transmission line is wired to the wiring layer in which the core material and the prepreg are disposed.

REFERENCE SIGNS LIST

100 Electronic device
109, 240 Signal line
110 Semiconductor chip
111 Solid-state imaging element
200, 201, 202 Mounting substrate
210 Digital signal processor
221 to 224 Solder resist
225 Cover lay
230 Wiring layer
231, 235 Core material
232, 233, 236, 237 Prepreg
251 to 259 Heat storage material
271 to 274 Copper foil
280 Base layer
311, 314 Accumulator
312 Surface processing solution tank
313 Heating furnace
321 Stirrer
322 Impregnated pad
323 Heater
324 Cutter
326 Press machine

The invention claimed is:

1. A substrate, comprising:
an insulating material having a first thermal conductivity;
a transmission line wired to the insulating material, wherein the transmission line is configured to transmit an electrical signal from a semiconductor chip; and
a wiring layer that includes a heat storage material, wherein
the transmission line is wired to the wiring layer,
the heat storage material has a second thermal conductivity,
the second thermal conductivity is higher than the first thermal conductivity,
the heat storage material accumulates latent heat based on a phase transition of the heat storage material, and
the phase transition occurs within an operating temperature range of the semiconductor chip.

2. The substrate according to claim 1, wherein
the substrate includes a flexible substrate,
the flexible substrate includes a base layer,
the transmission line is wired to the base layer, and
the base layer includes the insulating material.

3. The substrate according to claim 1, wherein
the substrate includes a rigid substrate, and
the wiring layer further includes:
a core material; and
a prepreg.

4. The substrate according to claim 3, wherein each of the core material and the prepreg includes the insulating material.

5. The substrate according to claim 3, wherein the prepreg includes each of the insulating material and the heat storage material.

6. The substrate according to claim 3, wherein the core material includes each of the insulating material and the heat storage material.

7. The substrate according to claim 3, further comprising a solder resist configured to cover a surface of the substrate, wherein the solder resist includes the heat storage material.

8. An electronic device, comprising:
a semiconductor chip;
an insulating material having a first thermal conductivity;
a transmission line wired to the insulating material, wherein the transmission line is configured to transmit an electrical signal from the semiconductor chip; and
a wiring layer that includes a heat storage material, wherein
the transmission line is wired to the wiring layer,
the heat storage material has a second thermal conductivity,
the second thermal conductivity is higher than the first thermal conductivity,
the heat storage material accumulates latent heat based on a phase transition of the heat storage material, and
the phase transition occurs within an operating temperature range of the semiconductor chip.

9. A method for manufacturing a substrate, the method comprising:
disposing, in a wiring layer of the substrate, a heat storage material that has a higher thermal conductivity than an insulating material of the substrate, wherein
the heat storage material accumulates latent heat based on a phase transition of the heat storage material, and
the phase transition occurs within an operating temperature range of a semiconductor chip; and
wiring a transmission line to the insulating material, wherein the transmission line transmits an electrical signal from the semiconductor chip.

10. The method for manufacturing the substrate according to claim 9, further comprising wiring the transmission line to the wiring layer, wherein the wiring layer includes:
a core material; and
a prepreg.

11. The method for manufacturing the substrate according to claim 9, further comprising:
coating a surface of the substrate with a solder resist, wherein
the wiring layer includes:
a core material; and
a prepreg, and
each of the core material and the prepreg includes the insulating material; and
disposing the heat storage material in at least one of the solder resist, the core material, or the prepreg; and
wiring the transmission line to the wiring layer.

* * * * *